United States Patent
Park et al.

(10) Patent No.: US 7,623,406 B2
(45) Date of Patent: *Nov. 24, 2009

(54) ACCESSING SEMICONDUCTOR MEMORY DEVICE ACCORDING TO AN ADDRESS AND ADDITIONAL ACCESS INFORMATION

(75) Inventors: Gi-Ho Park, Seoul (KR); Gun-Ok Jung, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 3 days.

This patent is subject to a terminal disclaimer.

(21) Appl. No.: 11/705,485

(22) Filed: Feb. 12, 2007

(65) Prior Publication Data

US 2007/0195598 A1  Aug. 23, 2007

(30) Foreign Application Priority Data

Feb. 13, 2006   (KR) ...................... 10-2006-0013854

(51) Int. Cl.
*G11C 8/00* (2006.01)

(52) U.S. Cl. .................... 365/230.06; 365/191; 365/207

(58) Field of Classification Search ............ 365/230.06, 365/189.09, 207, 191
See application file for complete search history.

(56) References Cited

U.S. PATENT DOCUMENTS

| 6,675,256 B1* | 1/2004 | Harrand ...................... 711/105 |
| 7,165,168 B2* | 1/2007 | McDonald .................. 712/238 |
| 7,227,791 B2* | 6/2007 | Park ....................... 365/189.08 |
| 2002/0080677 A1* | 6/2002 | Watanabe et al. ........... 365/233 |
| 2006/0013057 A1* | 1/2006 | Park ....................... 365/230.03 |
| 2006/0092712 A1* | 5/2006 | Park ....................... 365/189.01 |

OTHER PUBLICATIONS

U.S. Appl. No. 11/700,780 to Gi-Ho Park.*
Korean Patent Publication No. 1996-25764 having Publication date of Jul. 20, 1996 (w/ English Abstract page).
Korean Patent Publication No. 2000-0009468 having Publication date of Jun. 5, 2000 (w/ English Abstract page).
Korean Patent Publication No. 1020010026006 having Publication date of Apr. 6, 2001 (w/ English Abstract page).
Japanese Patent Publication No. 07-147096 having Publication date of Jun. 6, 1995 (w/ English Abstract page).

* cited by examiner

*Primary Examiner*—Hoai V Ho
*Assistant Examiner*—Kretelia Graham
(74) *Attorney, Agent, or Firm*—Monica H. Choi

(57) ABSTRACT

A semiconductor memory device includes a memory cell array, a decoder, and an access control unit. The decoder generates a word line voltage according to an address for a plurality of memory cells in the memory cell array. The access control unit controls access to the plurality of memory cells according to the word line voltage and additional access information separate from the address.

14 Claims, 6 Drawing Sheets

US 7,623,406 B2

ACCESSING SEMICONDUCTOR MEMORY DEVICE ACCORDING TO AN ADDRESS AND ADDITIONAL ACCESS INFORMATION

This application claims priority under 35 USC § 119 to Korean Patent Application No. 2006-13854, filed on Feb. 13, 2006 in the Korean Intellectual Property Office, the disclosure of which is incorporated herein in its entirety by reference.

BACKGROUND OF THE INVENTION

1. Field of the Invention

The present invention relates generally to semiconductor memory devices, and more particularly, to accessing a semiconductor memory device according to an address and additional access information.

2. Background of the Invention

A semiconductor memory device stores data and reads such stored data. The semiconductor memory device may be divided into a random access memory (RAM) and a read only memory (ROM). The ROM is a nonvolatile memory that retains stored data even when power is cut off. Examples of the ROM include a programmable ROM (PROM), an erasable PROM (EPROM), an electrically erasable PROM (EEPROM), a flash memory, and the like. The RAM is a volatile memory that loses stored data when power is cut off. Examples of the RAM include a dynamic RAM (DRAM) and a static RAM (SRAM).

In general, the semiconductor memory device includes a memory cell array, a decoder, and a sense amp. The memory cell array includes a plurality of memory cells connected to word lines and bit lines. The decoder provides a respective word line voltage to a selected word line in response to an address. The sense amp reads data stored in at least one selected memory cell as indicated by the address. That is, the semiconductor memory device reads data from the at least one memory cell connected to the selected word line.

However, the semiconductor memory device sometimes unnecessarily reads data from accessing memory cells connected to the selected word line. Such unnecessary reading occurs most commonly when the semiconductor memory device is used as a branch target buffer. In general, an SRAM is used for a branch target buffer.

In a branch prediction method using the branch target buffer, an embedded processor such as an ARM processor would consume much power accessing the branch target buffer for every instruction. To overcome this defect, the processor performs branch prediction in the case of a branch command, and attempts to access the branch target buffer according to a branch prediction result. Nevertheless in the prior art, the processor accesses some portions of the branch target buffer even when a branch is predicted as not taken such that power is unnecessarily consumed. In addition, the branch prediction method of the prior art undesirably complicates control logic and increases a delay of fetch logic.

As described in the aforementioned example of the branch target buffer, the conventional semiconductor memory device always accesses at least one memory cell connected to a selected word line. Thus, the conventional semiconductor memory device outputs unnecessary data, inefficiently consuming power and time.

SUMMARY OF THE INVENTION

Accordingly, the semiconductor memory device of the present invention uses access information in addition to an address to control access to memory cells.

A semiconductor memory device according to an aspect of the present invention includes a memory cell array, a decoder, and an access control unit. The decoder generates a word line voltage according to an address for a plurality of memory cells in the memory cell array. The access control unit controls access to the plurality of memory cells according to the word line voltage and additional access information separate from the address.

In an embodiment of the present invention, the access control unit includes an access information storage unit and a logic unit. The access information storage unit stores the additional access information. The logic unit performs logical operation on the word line voltage and the access information to generate a control signal.

In a further embodiment of the present invention, the semiconductor memory device further includes a sense amplifier, and the control signal is used as a sense amplifier enable signal that controls coupling of bit-lines of the plurality of memory cells to the sense amplifier.

In another embodiment of the present invention, the control signal is used as a gated word line voltage applied on control gates of the plurality of memory cells forming a row in the memory cell array.

In an example embodiment of the present invention, the access information storage unit is an SRAM cell storing 1-bit data.

In a further embodiment of the present invention, the logic unit performs logical operation on the word line voltage, the access information, and a write signal. In that case, the logic unit includes an OR-gate and an AND-gate. The OR-gate inputs the access information and the write signal. The AND-gate inputs an output of the OR-gate and the word line voltage. An output of the AND-gate is the control signal that determines whether the plurality of memory cells are accessed for a read operation. In addition, the output of the OR-gate causes the plurality of memory cells to be accessed for a write operation.

The present invention may be used to particular advantage when the semiconductor memory device is a branch target buffer, and the additional access information is generated by a branch target predictor.

In another embodiment of the present invention, the semiconductor memory device further includes a plurality of access control units. In that case, the decoder generates a respective word line voltage for each row in the memory cell array according to the address. Furthermore, each of the access control units controls access to a respective row of memory cells according to a respective word line voltage and a respective additional access information for the respective row.

In this manner, additional access information is used for controlling access to the memory cells associated with a selected word line in addition to the address specifying the selected word line. The additional access information is used for preventing unnecessary access to the memory cells of the selected word line to reduce power consumption and operating time in the semiconductor memory device.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, and 6 refer to elements having similar structure and/or function.

DETAILED DESCRIPTION OF THE INVENTION

Figure 1:
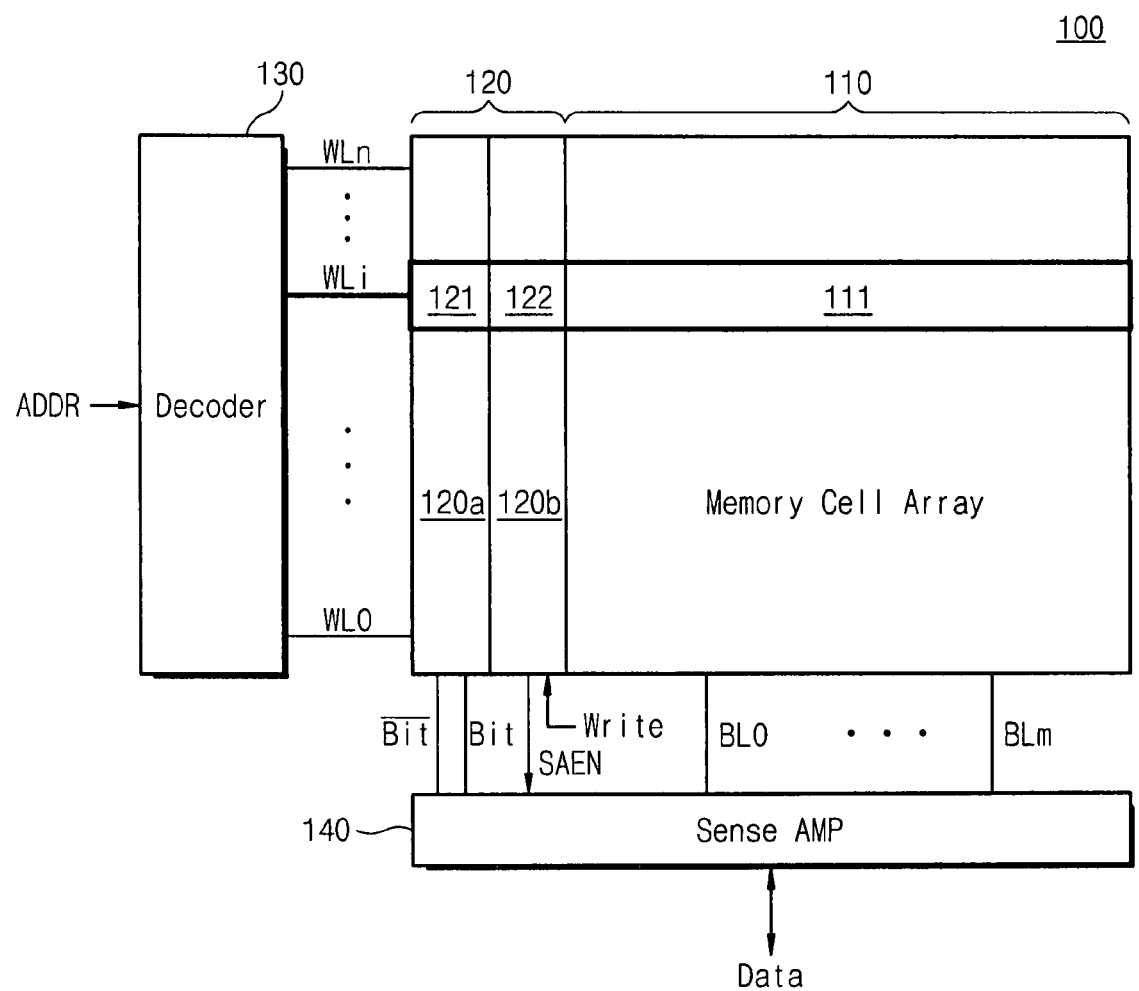
FIG. 1 is a block diagram of a semiconductor memory device using additional access information according to an embodiment of the present invention.
Figure 5:
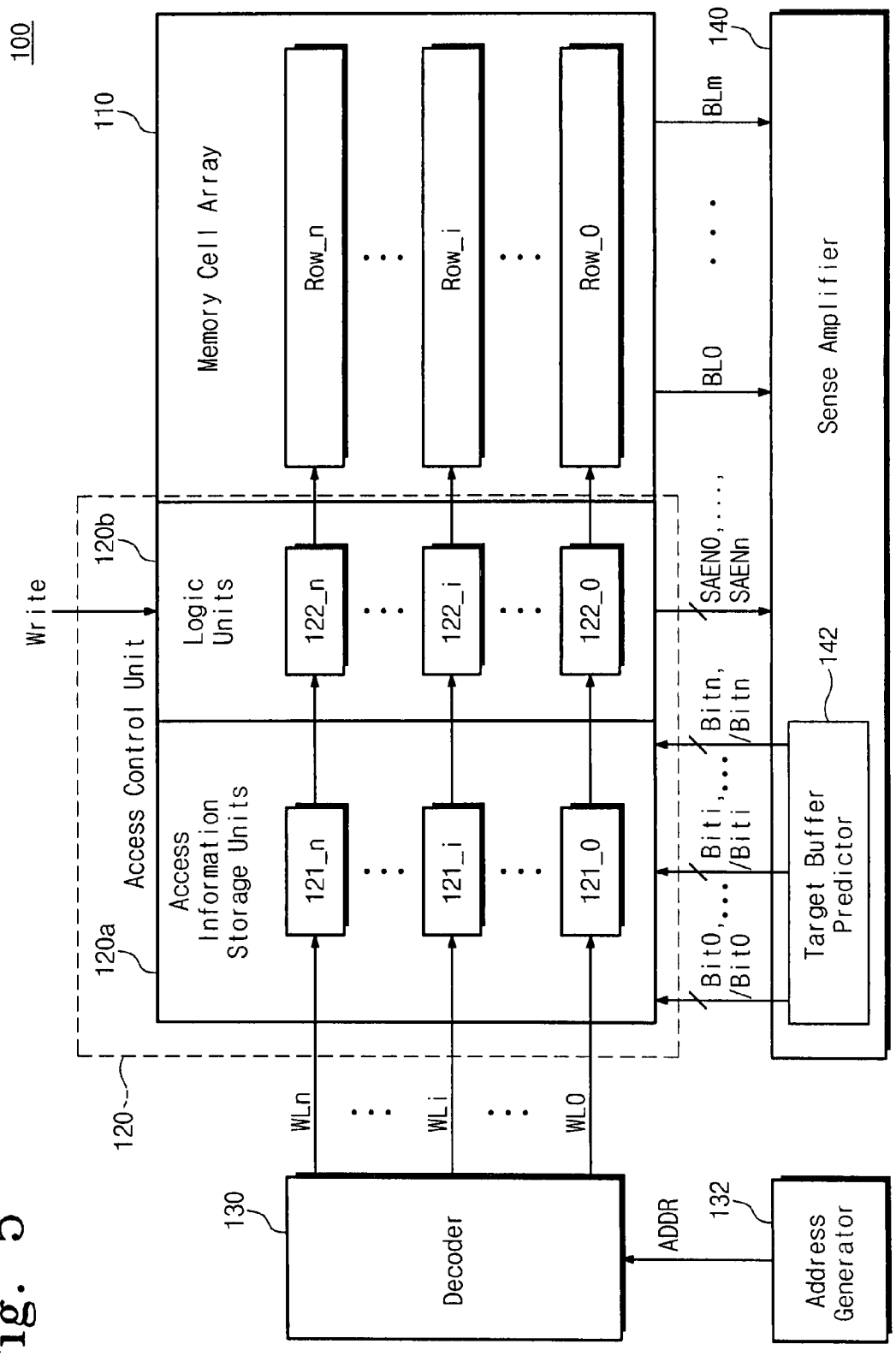
FIG. 5 is a block diagram of the semiconductor memory device of FIG. 1 with additional components, according to an embodiment of the present invention.

FIGS. 1 and 5 show block diagrams of a semiconductor memory device 100 according to an embodiment of the present invention. Referring to FIGS. 1 and 5, the semiconductor memory device 100 includes a memory cell array 110, an access control unit 120, a decoder 130, and a sense amplifier 140.

The semiconductor memory device 100 may be a volatile memory such as an SRAM, a DRAM or the like, or may be a non-volatile memory such as a flash memory, a PRAM, or the like. Hereinafter, the semiconductor memory device 100 is described as being an SRAM according to an example embodiment of the present invention.

The decoder 130 receives an address ADDR from an address generator 132 that specifies at least one memory cell corresponding to the address for being accessed. The address generator 132 generates the address ADDR that typically includes a row address and a column address for specifying at least one memory cell of the memory cell array 110 to be accessed.

For example, the decoder 130 generates a respective word line voltage to be applied on each of a plurality of word lines WL0 to WLn according to the address ADDR. One of the word lines WL0 to WLn has a boosted word line voltage applied thereon as specified by the address ADDR. Each of the word lines WL0 to WLn is coupled to a respective row of memory cells of the memory cell array 110 in an example embodiment of the present invention.

The sense amplifier 140 is coupled to the bit lines BL0 to BLm of the memory cell array 110. The sense amplifier 140 is used to determine the data represented at such bit lines BL0 to BLm of the memory cell array 110. The sense amplifier 140 also includes a target buffer predictor 142 in an embodiment of the present invention. However, the present invention may be practiced with the target buffer predictor 142 being disposed outside of the sense amplifier 140.

The structure of each memory cell in the memory cell array 110 depends on the kind of the semiconductor memory device 100. For example, an SRAM cell generally includes four NMOS transistors and two PMOS transistors. Of them, the two NMOS transistors are selection transistors connected to the word line, and the other two NMOS transistors and the two PMOS transistors form a latch circuit for storing data, as known to one of ordinary skill in the art. Other configurations and operations of the SRAM cell may also be known to one of ordinary skill in the art.

The control access unit 120 is connected between the memory cell array 110, the decoder 130, the target buffer predictor 142, and the sense amplifier 140. The control access unit 120 includes access information storage units 120a and logic units 120b.

The access information storage units 120a are comprised of a plurality of access information storage units 121_0 to 121_n connected to the word lines WL0 to WLn, respectively. Each of the access information storage units 121_0 to 121_n stores access information for a respective one of the word lines WL0 to WLn. The respective access information determines whether the memory cells coupled to the respective one of the word lines WL0 to WLn is to be accessed. The target buffer predictor 142 generates respective complementary pairs of access bit line signals Bit0 and /Bit0 to Bitn and /itn for the access information storage units 121_0 to 121_n, respectively.

The logic units 120b are comprised of a plurality of logic units 122_0 to 122_n connected to the access storage units 121_0 to 121_n, respectively. Each of the logic units 121_0 to 121_n generates a respective one of the sense amp enable signals SAEN0 to SAENn according to the respective stored access information. The sense amp enable signals SAEN0 to SAENn are supplied to the sense amp 140.

The sense amplifier 140 reads data from the at least one memory cell associated with the address ADDR only if at least one of the sense amp enable signals SAEN0 to SAENn is activated. Otherwise if the sense amp enable signals SAEN0 to SAENn are all deactivated, the sense amplifier 140 does not access the at least one memory cell associated with the address ADDR.

Figure 2:
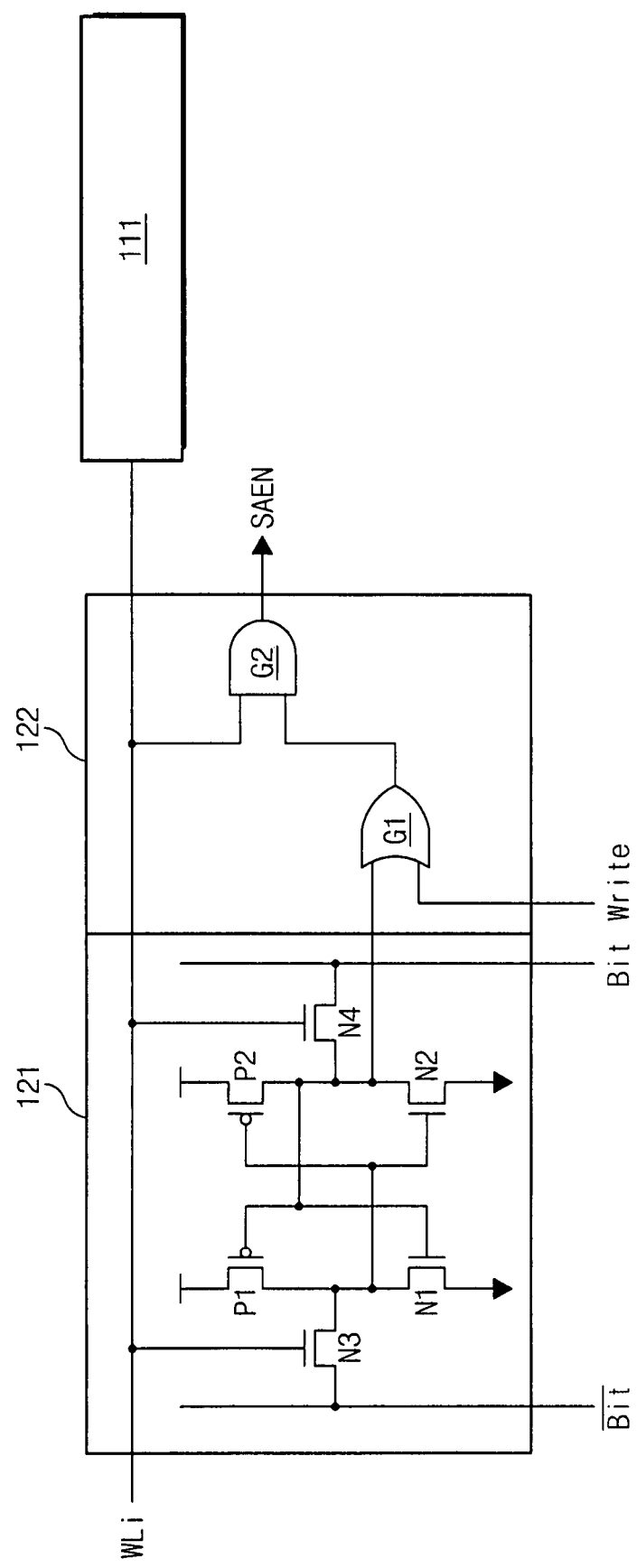
FIG. 2 is a circuit diagram of an example access information storage unit and logic unit used in the semiconductor memory device of FIG. 1, according to an embodiment of the present invention.

FIG. 2 shows a circuit diagram of an example access information storage unit 121 and an example logic unit 122. Each of the access information storage units 121_0 to 121_n may be implemented similarly to the example access information storage unit 121, and each of the logic units 122_0 to 122_n may be implemented similarly to the example logic unit 122.

In the example of FIG. 2, the access information storage unit 121 is implemented as a 1-bit SRAM cell for storing 1-bit data as the access information. The 1_bit SRAM cell 121 includes first and second PMOS transistors P1 and P2, and first, second, third, and fourth NMOS transistors N1, N2, N3, and N4. The third and fourth NMOS transistors N3 and N4 are configured as selection transistors, and the first and second NMOS transistors N1 and N2 and the PMOS transistors P1 and P2 are configured as a latch for storing the access information at the respective access bit lines Bit and /Bit.

The respective word line WLi is connected to gates of the third and fourth NMOS transistors N3 and N4, and the respective access bit lines Bit and /Bit are connected to the drains of such transistors N3 and N4. 1_bit data is stored at the node coupled to the drains of the second PMOS transistor P2 and the second NMOS transistor N2. Referring to FIGS. 1, 2, and 5, the target buffer predictor 142 generates the respective complementary pair of access bit line signals Bit and /Bit corresponding to the example access information storage unit 121.

The logic unit 122 generates the respective sense amp enable signal SAEN from the access information stored in the access information storage unit 121, the word line voltage at the respective word line WLi, and a Write signal. The logic unit 122 includes an OR-gate G1 inputting the 1-bit access data stored in the access information storage unit 121 and the Write signal. The logic unit 122 also includes an AND-gate G2 inputting an output of the OR-gate G1 and the word line voltage at the respective word line WLi.

In the embodiment of FIG. 2, assume that the word line voltage at the respective word line WLi is activated to the logic high state by the decoder 130 as specified by the address ADDR. The word line voltage at the respective word line WLi is also applied on the at least one memory cell 111 corresponding to the address ADDR. In the embodiment of FIG. 5, a respective row of memory cells Row_i corresponds to the address ADDR. Thus, the word line voltage at the respective word line WLi is applied on the row of memory cells Row_i.

If the Write signal is activated to the logic high state indicating a write operation for the address ADDR, the output of the OR-gate G1 is activated to the logic high state. The Write signal may be generated from a memory controller (not shown) of the semiconductor memory device 100. Thus in that case, the corresponding sense amp enable signal SAEN is activated to the logic high state such that the corresponding memory cells 111 are accessed for the write operation, irrespective of the 1-bit access data stored in the access information storage unit 121.

If the Write signal is deactivated to the logic low state indicating a read operation for the address ADDR, the output of the OR-gate G1 depends on the 1-bit access data stored in the access information storage unit 121. In that case if the 1-bit access data stored in the access information storage unit 121 is activated to the logic high state, the sense amp enable signal SAEN is activated to the logic high state such that the corresponding memory cells 111 are accessed for the read operation via the sense amplifier 140. Otherwise if the 1-bit access data stored in the access information storage unit 121 is deactivated to the logic low state, the sense amp enable signal SAEN is deactivated to the logic low state such that the corresponding memory cells 111 are not accessed for the read operation via the sense amplifier 140.

Figure 3:
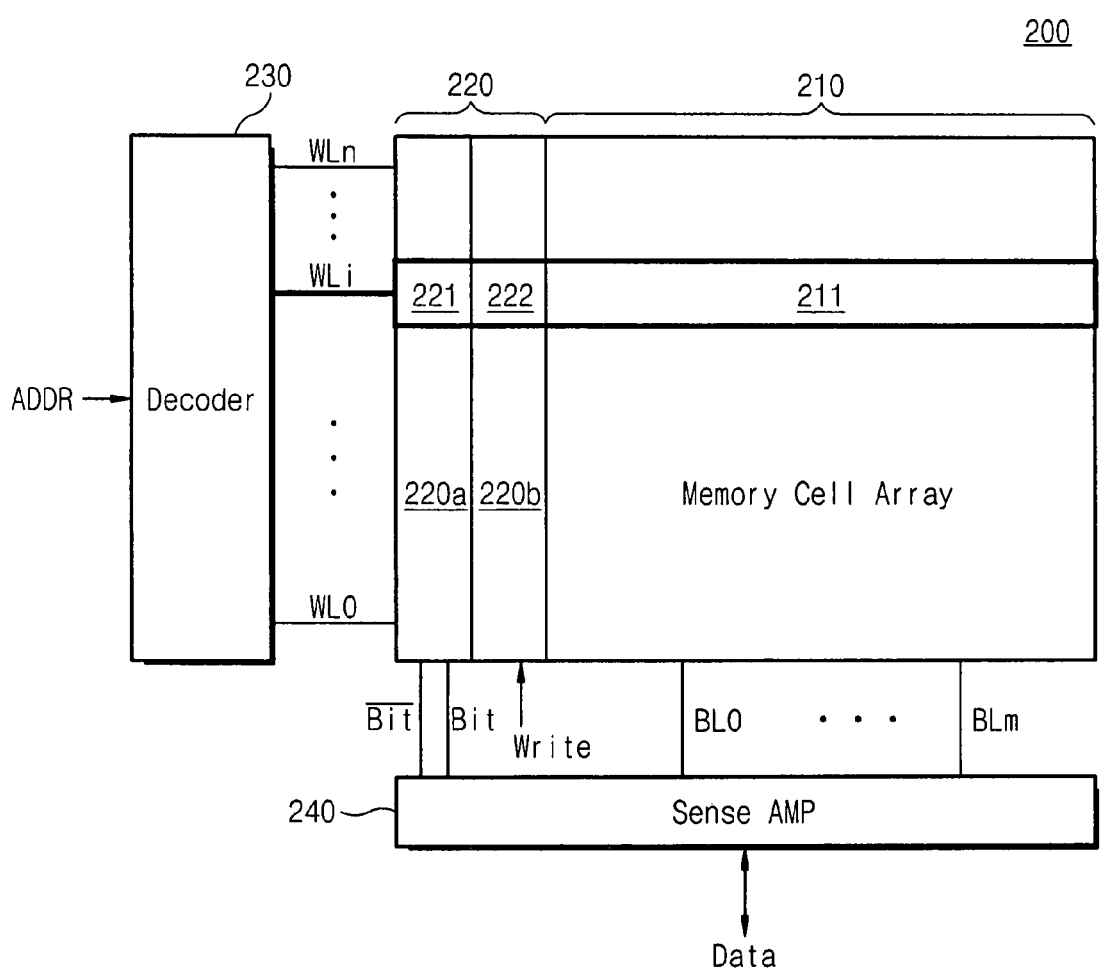
FIG. 3 is a block diagram of a semiconductor memory device generating gated word line voltages according to another embodiment of the present invention.
Figure 6:
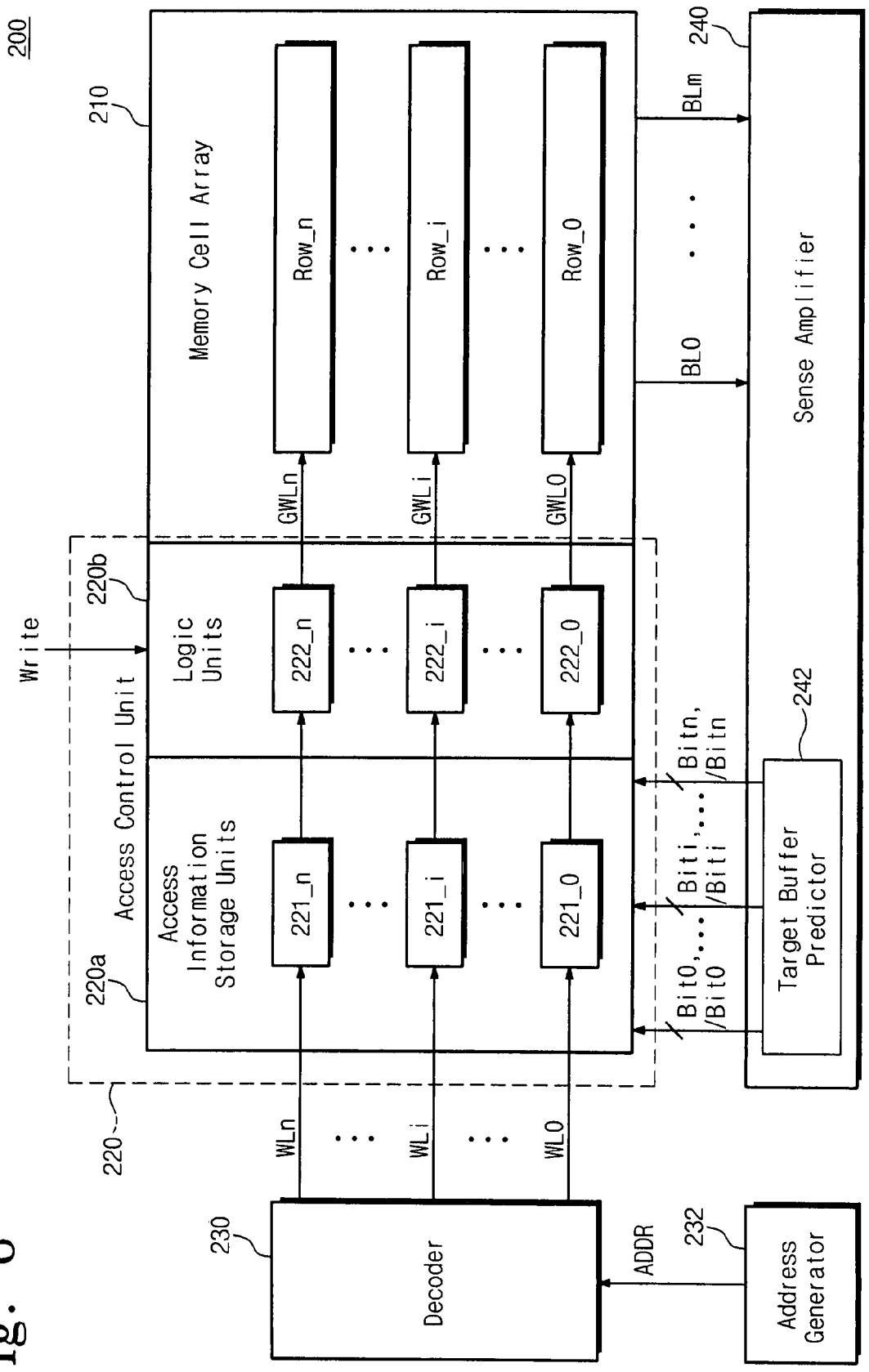
FIG. 6 is a block diagram of the semiconductor memory device of FIG. 3 with additional components, according to an embodiment of the present invention.

FIGS. 3 and 6 show a block diagram of a semiconductor memory device 200 according to another embodiment of the present invention. Referring to FIGS. 3 and 6, the semiconductor memory device 200 includes a memory cell array 210, an access control unit 220, a decoder 230, an address generator 232, and a sense amplifier 240. The memory cell array 210, the decoder 230, the address generator 232, and a target buffer 242 in FIGS. 3 and 6 are similar to the components 110, 130, 132, and 142, respectively, of FIGS. 1 and 5.

The access control unit 220 is connected between the memory cell array 210, the decoder 230, and the target buffer 242. The access control unit 220 includes access information storage units 220a and logic units 220b.

The access information storage units 220a include a plurality of access information storage units 221_0 to 221_n connected to the word lines WL0 to WLn, respectively. Each of the access information storage units 221_0 to 221_n stores access information for a respective one of the word lines WL0 to WLn. The respective access information determines whether the memory cells coupled to the respective one of the word lines WL0 to WLn is to be accessed. The target buffer predictor 242 generates respective complementary pairs of access bit line signals Bit0 and /Bit0 to Bitn and /Bitn for the access information storage units 221_0 to 221_n, respectively.

The logic units 220b are comprised of a plurality of logic units 222_0 to 222_n connected to the word lines WL0 to WLn, respectively, and connected to the access storage units 221_0 to 221_n, respectively. Each of the logic units 221_0 to 221_n generates a respective one of gated word line voltages GWL0 to GWLn, according to the respective stored access information. Each of such gated word line voltages GWL0 to GWLn is applied on a respective group of memory cells of the memory cell array 210. For example, the gated word line voltages GWL0 to GWLn are applied on control gates of rows of memory cells Row_0 to Row_n, respectively.

Figure 4:
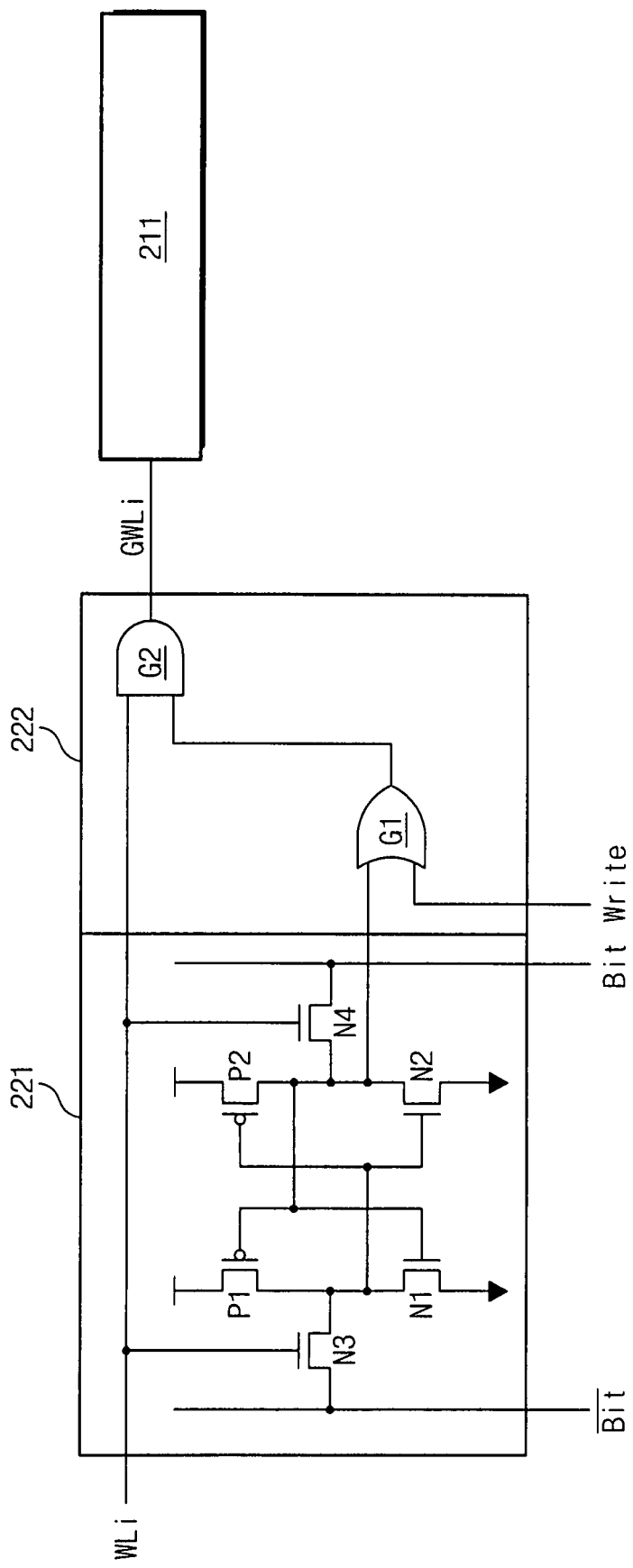
FIG. 4 is a circuit diagram of an example access information storage unit and logic unit used in the semiconductor memory device of FIG. 3, according to an embodiment of the present invention.

FIG. 4 shows a circuit diagram of an example access information storage unit 221 and an example logic unit 222. Each of the access information storage units 221_0 to 221_n may be implemented similarly to the example access information storage unit 221, and each of the logic units 222_0 to 222_n may be implemented similarly to the example logic unit 222.

Similar to FIG. 2, the access information storage unit 221 of FIG. 4 is implemented as a 1-bit SRAM cell for storing 1-bit data as the access information. Referring to FIGS. 3, 4, and 6, the target buffer predictor 242 generates the respective complementary pair of access bit line signals Bit and /Bit for storing the 1-bit data as the access information in the example access information storage unit 221.

The logic unit 222 generates the respective gated word line voltage GWLi from the access information stored in the access information storage unit 221, the word line voltage at the respective word line WLi, and a Write signal. The logic unit 222 includes an OR-gate G1 inputting the 1-bit access data stored in the access information storage unit 221 and the Write signal. The logic unit 222 also includes an AND-gate G2 inputting an output of the OR-gate G1 and the word line voltage at the respective word line WLi.

The gated word line voltage GWLi generated by the logic unit 222 is applied on the at least one memory cell 211 corresponding to the address ADDR. In the embodiment of FIG. 6, a respective row of memory cells Row_i corresponds to the address ADDR. Thus, the gated word line voltage GWLi generated by the logic unit 222 is applied on control gates of the row of memory cells Row_i.

In the embodiment of FIG. 4, assume that the word line voltage at the respective word line WLi is activated to the logic high state by the decoder 230 as specified by the address ADDR. If the Write signal is activated to the logic high state indicating a write operation for the address ADDR, the output of the OR-gate G1 is activated to the logic high state. Thus in that case, the gated word line voltage GWLi is activated to the logic high state such that the corresponding memory cells 211 are accessed for the write operation, irrespective of the 1-bit access data stored in the access information storage unit 221.

If the Write signal is deactivated to the logic low state indicating a read operation for the address ADDR, the output of the OR-gate G1 depends on the 1-bit access data stored in the access information storage unit 221. In that case if the 1-bit access data stored in the access information storage unit 221 is activated to the logic high state, the gated word line voltage GWLi is activated to the logic high state such that the corresponding memory cells 211 are accessed for the read operation.

Otherwise if the 1-bit access data stored in the access information storage unit 221 is deactivated to the logic low state, the gated word line voltage GWLi is deactivated to the logic low state. Thus in that case, the corresponding memory cells 211 are not accessed for the read operation.

In this manner, the semiconductor memory device accesses memory cells corresponding to the address ADDR depending on the type of access operation (i.e., read or write operation) and the additional access information stored in the access storage unit 120a or 220a. The additional access information is separate data from the usual address ADDR generated by the typical address generator 132 or 232 of a semiconductor memory device. Thus, such access information may be used to over-ride access to the memory cells specified by the address ADDR from an address generator.

Such use of access information may be used to particular advantage for minimizing unnecessary power consumption. Also, since access information is stored in 1_bit SRAM cells and the logic units 120b or 220b are implemented with few logic gates, the access control unit 120 or 220 are implemented with simple circuitry and minimized time delay.

The semiconductor memory device 100 or 200 may be used to particular advantage as a branch target buffer performing branch prediction. That is, branch prediction information as generated by the target branch predictor 142 or 242 is stored in the 1_bit SRAM cells. Namely, in such a branch target buffer, access to the memory cell array as specified by the address ADDR is made only when the branch prediction information indicates 'taken' information, and access is denied when the branch prediction information indicates 'not-taken' information. Since no access to the memory cell is made in the case of the 'not-taken' information in the branch target buffer, unnecessary power consumption may be reduced.

A result obtained from simulation indicates that more than about 40% of branches may be predicted as not-taken. Consequently, power consumption for access to the semiconductor memory device 100 or 200 may be reduced by about 40%.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

The present invention is limited only as defined in the following claims and equivalents thereof.

What is claimed is:

1. A semiconductor memory device comprising:
   a memory cell array;
   a decoder for generating a word line voltage according to an address for a plurality of memory cells in the memory cell array;
   an access control unit that controls access to the plurality of memory cells according to the word line voltage and additional access information separate from said address, wherein the access control unit includes:
     an access information storage unit for storing said additional access information; and
     a logic unit performing logical operation on the word line voltage and the access information to generate a control signal; and
   a sense amplifier, wherein the control signal is used as a sense amplifier enable signal that controls coupling of bit-lines of the plurality of memory cells to the sense amplifier.

2. The semiconductor memory device of claim 1, wherein the access information storage unit is an SRAM cell storing 1-bit data.

3. The semiconductor memory device of claim 1, wherein the logic unit performs logical operation on the word line voltage, the access information, and a write signal.

4. The semiconductor memory device of claim 3, wherein the logic unit includes:
   an OR-gate inputting the access information and the write signal; and
   an AND-gate inputting an output of the OR-gate and the word line voltage, wherein an output of the AND-gate is the control signal that determines whether the plurality of memory cells are accessed for a write operation.

5. The semiconductor memory device of claim 4, wherein the output of the OR-gate causes the plurality of the memory cells to be accessed for the write operation.

6. The semiconductor memory device of claim 1, further comprising:
   a plurality of access control units;
   wherein the decoder generates a respective word line voltage for each row in the memory cell array according to the address,
   and wherein each of the access control units controls access to a respective row of memory cells according to the respective word line voltage and a respective additional access information for the respective row.

7. A method of accessing a semiconductor memory device, comprising:
   generating a word line voltage for a plurality of memory cells in a memory cell array of the semiconductor memory device according to an address;
   controlling access to the plurality of memory cells according to the word line voltage and additional access information separate from said address;
   storing said additional access information in said semiconductor memory device;
   performing logical operation on the word line voltage and the access information to generate a control signal; and
   using the control signal as a sense amplifier enable signal that controls coupling of bit-lines of the plurality of memory cells to a sense amplifier of the semiconductor memory device.

8. The method of claim 7, wherein the access information storage unit is an SRAM cell storing 1-bit data.

9. The method of claim 7, further comprising:
   performing logical operation on the word line voltage, the access information, and a write signal to generate the control signal.

10. The method of claim 9, further comprising:
    applying the access information and the write signal to inputs of an OR-gate; and
    applying an output of the OR-gate and the word line voltage to inputs of an AND-gate, wherein an output of the AND-gate generates the control signal that determines whether the plurality of memory cells are accessed for a write operation.

11. The method of claim 10, wherein the output of the OR-gate causes the plurality of the memory cells to be accessed for the write operation.

12. The method of claim 7, further comprising:
    generating a respective word line voltage for each row in the memory cell array according to the address; and
    controlling access to each row of the memory cell array according to the respective word line voltage and a respective additional access information for each row.

13. A semiconductor memory device comprising:
    a memory cell array;
    a decoder for generating a word line voltage according to an address for a plurality of memory cells in the memory cell array;
    an access control unit that controls access to the plurality of memory cells according to the word line voltage and additional access information separate from said address,
    wherein the semiconductor memory device is a branch target buffer, and wherein the additional access information is generated by a branch target predictor;

wherein the access control unit includes:
an access information storage unit for storing said additional access information; and
a logic unit performing logical operation on the word line voltage and the access information to generate a control signal; and
a sense amplifier, wherein the control signal is used as a sense amplifier enable signal that controls coupling of bit-lines of the plurality of memory cells to the sense amplifier.

14. A method of accessing a semiconductor memory device, comprising:
generating a word line voltage for a plurality of memory cells in a memory cell array of the semiconductor memory device according to an address;
controlling access to the plurality of memory cells according to the word line voltage and additional access information separate from said address;
wherein the semiconductor memory device is a branch target buffer, and wherein the additional access information is generated by a branch target predictor;
storing said additional access information in said semiconductor memory device;
performing logical operation on the word line voltage and the access information to generate a control signal; and
using the control signal as a sense amplifier enable signal that controls coupling of bit-lines of the plurality of memory cells to a sense amplifier of the semiconductor memory device.

* * * * *